United States Patent
Hart

(10) Patent No.: US 6,577,196 B2
(45) Date of Patent: Jun. 10, 2003

(54) METHOD AND CIRCUIT FOR AUTOMATIC GAIN CONTROL OF A SIGNAL AMPLIFIER

(75) Inventor: Siegfried Hart, Kleinhoehenrain (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/945,344

(22) Filed: Aug. 30, 2001

(65) Prior Publication Data

US 2002/0113654 A1 Aug. 22, 2002

(30) Foreign Application Priority Data

Sep. 4, 2000 (DE) .......................................... 100 43 436

(51) Int. Cl.[7] ................................................ H03G 3/10
(52) U.S. Cl. ........................ 330/279; 330/129; 330/140
(58) Field of Search ................................ 330/279, 129, 330/140, 136

(56) References Cited

U.S. PATENT DOCUMENTS

| | | | | |
|---|---|---|---|---|
| 4,124,825 A | * | 11/1978 | Webb et al. ................ | 330/279 |
| 4,360,787 A | * | 11/1982 | Galpin ........................ | 330/284 |
| 5,051,707 A | * | 9/1991 | Fujita .......................... | 330/279 |
| 6,038,432 A | * | 3/2000 | Onoda ........................ | 455/127 |

FOREIGN PATENT DOCUMENTS

DE     OS 2 161 657     6/1973

* cited by examiner

*Primary Examiner*—Henry Choe
(74) *Attorney, Agent, or Firm*—Fish & Richardson PC

(57) ABSTRACT

Automatic gain control circuit for setting the gain of a signal amplifier having a peak value detector for measuring signal amplitudes of the analogue signal which is amplified by the signal amplifier, a comparator circuit which compares the measured signal amplitudes with an upper threshold value and a lower threshold value and generates digital range display data items which in each case indicate whether the measured signal amplitudes lie below the lower threshold value, between the two threshold values or above the upper threshold value, and having a digital control circuit which incrementally changes the gain of the signal amplifier as a function of the generated digital range display data until the digital range display data indicate that the measured signal amplitudes between the two threshold values lie in a lock-in amplitude range.

10 Claims, 2 Drawing Sheets

METHOD AND CIRCUIT FOR AUTOMATIC GAIN CONTROL OF A SIGNAL AMPLIFIER

The invention relates to a method and circuit for automatic gain control of a signal amplifier, which is customarily used in integrated circuits for service-integrated communications networks ISDN, broadband data communication and networks.

BACKGROUND

In communications technology, both user data and the clock signal on which the user data is based are conventionally transmitted over the transmission channel. At the receiver end, both the user data and the clock signal are then recovered from the received data mixture by means of a CDR (Clock and Data Recovery) circuit. The amplitude of the received data signal has an amplitude attenuation which is dependent on the length of the transmission path. Because the length of the transmission path, and thus the amplitude attenuation, are generally not known, it varies the signal amplitude of the received signal correspondingly. In addition, in many applications the amplitude of the transmission signal which is input into the transmission path is not known. In order to ensure the method of operation of the CRD circuit, an adjustable amplifier attenuator (VGA; Variable Gain Amplifier) is therefore connected between the output of the transmission path or of the transmission channel and the input of the CDR circuit. The adjustable signal amplifier is conventionally operated in a control loop (AGC: Automatic Gain Control Loop) in such a way that a signal with a constant amplitude value is output to the CDR circuit connected downstream of the signal amplifier VGA by the adjustable amplifier VGA independently of the value of the received signal amplitude of the input signal.

The voltage or signal amplitude of the signal output by the variable signal amplifier is conventionally set in such a way that it corresponds to a predefined reference voltage or reference signal amplitude. The output signal of the adjustable signal amplifier is compared here with the reference voltage in a comparator. The signal which is output by the comparator signal sets the gain of the controllable signal amplifier over a controlled system in such a way that the output signal voltage of the adjustable signal amplifier corresponds to the reference voltage. The conventional analogue gain control is defined by a relatively high level of precision of the control, but has the disadvantage that the analogue circuit arrangement is more difficult to integrate in comparison with digital circuit arrangements and requires additional circuit components.

A purely digital implementation of the gain control circuit is relatively easy to integrate on a chip and affords the possibility of rapid conversion to new manufacturing technologies by the use of synthesis tools. The digital implementation is additionally insensitive to process fluctuations in the manufacturing process of the integrated circuit. A disadvantage of a purely digital gain control circuit is however the inherent quantization by the digital discrete representation of numerical values within the control loop. In a purely digital circuit arrangement and implementation of the gain circuit, control precision can therefore be achieved only to the smallest discretization level.

SUMMARY

The object of the present invention is therefore to provide a gain control circuit and a method for automatic gain control of the signal amplifier in which the gain control is carried out with a very high degree of precision and can be simultaneously easily The invention provides an automatic gain control circuit for setting the signal gain of a signal amplifier having a peak value detector for measuring the signal amplitudes of the analogue signal which is amplified by the signal amplifier;

a comparator circuit which compares the measured signal amplitudes with an upper amplitude threshold value and et lower amplitude threshold value and generates digital range display data items which indicate whether the measured signal amplitudes lie below the lower amplitude threshold value, between the two amplitude threshold values, or above the upper amplitude threshold value, and having a digital control circuit which incrementally changes the gain of the signal amplifier as a function of the generated digital display data until the digital range display data indicate that the measured signal amplitudes between the two amplitude threshold values lie in a lock-in amplitude range.

The threshold values of the comparator circuit can preferably be set in an analogue fashion.

In one preferred embodiment, the peak value detector carries out a measurement sequence in order to measure a series of signal amplitudes which are each compared with the amplitude threshold values by the comparator circuit in order to generate a range display data group composed of a plurality of range display data items.

The digital control circuit changes the signal gain of the signal amplifier incrementally until the portion of the digital range display data items of a range display data group which indicate that the measured signal amplitudes lie in the lock-in amplitude range exceeds a predefined first minimum portion threshold value.

This provides the particular advantage that noise and interference (spikes) within the analogue signal amplifiers which usually occur in the voltage supply and in the signal path are very largely suppressed.

In a further particularly preferred embodiment, after the lock-in amplitude range has been reached, the digital control circuit keeps the gain of the signal amplifier constant until the portion of the digital range display data items of a range display data group which indicate that the measured signal amplitudes lie in the lock-in amplitude range drops below a predefined second minimum portion threshold value.

This digital hysteresis improves the adaptation reliability and the signal noise tolerance of the automatic gain control.

The minimum portion threshold values are preferably adjustable.

The second minimum portion threshold value is preferably smaller than the first minimum portion threshold value here.

In a particularly preferred embodiment, the gain level increment of the gain levels with which the signal gain of the signal amplifier can be incrementally changed is also adjustable.

The automatic gain control circuit preferably has a memory for storing the gain level increment and the two minimum portion threshold values.

The digital control circuit preferably has a display data buffer for buffering the generated digital range display data.

The invention also provides a method for automatic gain control of a signal amplifier having the following steps, namely measuring a sequence of signal amplitudes of a received analogue signal, comparing the measured signal amplitudes with a lower analogue adjustable amplitude threshold value and an upper analogue adjustable amplitude threshold value, generating a range display data group composed of a sequence of range display data items, a range display data item indicating in each case for an associated measured signal amplitude whether the measured signal amplitude lies below the lower amplitude threshold value, between the two amplitude threshold values or above the upper amplitude threshold value, incremental changing of the signal gain of the signal amplifier until the portion of the range display data items of a range display data sequence which indicates that the associated measured signal amplitudes between the two amplitude threshold values lie in a lock-in amplitude range exceeds a predefined minimum portion threshold value.

Preferred embodiments of the automatic gain control circuit according to the invention and of the method according to the invention for automatic gain control of the amplifier will be described below with reference to the appended drawings in order to explain features essential to the invention.

In the drawing:

DETAILED DESCRIPTION

Figure 1:
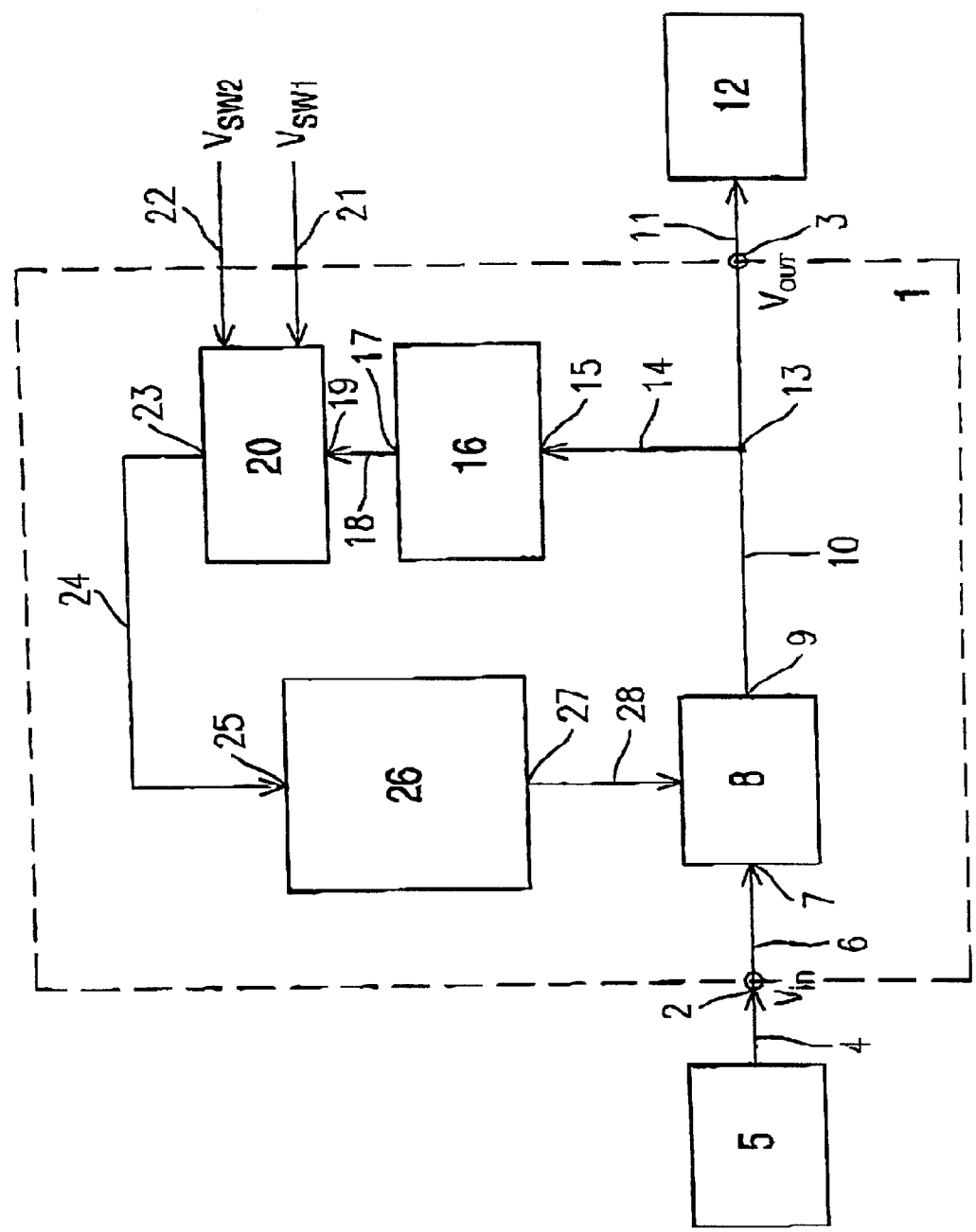
FIG. 1 is a block circuit diagram of a preferred embodiment of the automatic gain control circuit according to the invention.

As is clear from FIG. 1, the automatic gain control circuit 1 according to the invention has an analogue signal input 2 and an analogue signal output 3. The analogue signal input 2 is connected via an analogue signal line 4 to an analogue transmission path 5. The automatic gain control circuit 1 receives an analogue data signal via the analogue transmission path or the transmission channel. The transmission path 5 is, for example, a coaxial cable. The signal amplitude of the analogue data signal transmitted over the transmission path 5 fluctuates as a function of the amplitude attenuation of the transmission channel 5 which is not fixed.

The received signal $V^{(n)}$ passes via the analogue signal input 2 of the gain control circuit 1 and an internal signal line 6 to a signal input 7 of an adjustable signal amplifier 8. The gain of the signal amplifier 8 can be adjusted digitally. The adjustable signal amplifier 8 has a signal output 9 which is connected via an internal signal line 10 to the analogue signal output 3 of the signal amplifier 1. The analogue signal output 3 is preferably connected via a line 11 to a CDR circuit 12 for recovering the data and the clock signal. The signal which is amplified by the signal amplifier 8 is branched off at a signal branch node 13 and input into a peak value detector 16 via an internal signal line 14 and a signal input 15.

The peak value 16 measures the signal amplitude of the amplified analogue signal which is output by the signal amplifier 8 and outputs the measured signal amplitude values to an input 19 of a comparator circuit 20 via an output 17 and lines 18.

The comparator circuit 20 receives via setting outlines 21, 22 a lower analogue amplitude threshold value $V_{sw1}$ and an upper analogue amplitude threshold value $V_{sw2}$. The two amplitude threshold values $V_{sw1}$ and $V_{sw2}$ are preferably adjustable. The measured signal amplitudes which are output by the peak value detector 16 are compared in analogue fashion with the two amplitude threshold values by the comparator circuit 20. The comparator circuit 20 generates an associated digital range display data item as a function of the comparison results for each measured analogue signal amplitude value, which range display data item indicates whether the measured analogue signal amplitude lies below the lower amplitude threshold value, between the two amplitude threshold values in lock-in amplitude range or above the upper amplitude threshold value $V_{sw2}$. The range display data which are generated are output to a digital signal output 23 of the comparator circuit 20 via digital data lines 24 to a data input 25 of a digital control circuit 26. The digital control circuit 26 has a control signal output 27 which controls or sets the signal gain of the adjustable signal amplifier 8 via digital control signal lines 28.

Figure 2:
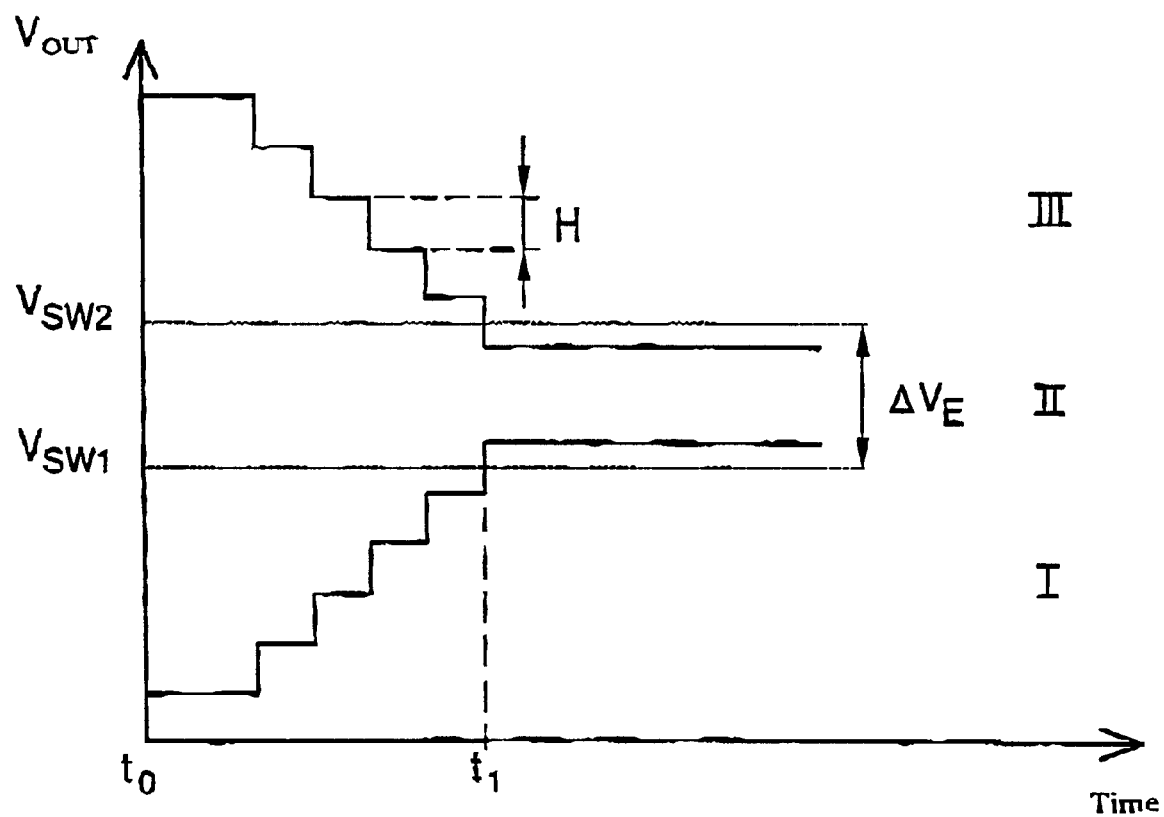
FIG. 2 is a signal chart explaining the method of operation of the automatic gain control circuit illustrated in FIG. 1.

FIG. 2 shows a signal chart explaining the method of operation of the automatic gain control circuit 1 illustrated in FIG. 1. The two adjustable amplitude threshold values $V_{sw1}$, $V_{sw2}$ define three signal amplitude ranges I, II, III.

In the signal amplitude range I, the output signal $V_{out}$ which is output by the signal amplifier is located in a low signal amplitude range and the signal gain of the signal amplifier 8 is correspondingly increased incrementally.

In the signal amplitude range III, the signal amplitude of the amplified analogue signal which is output by the signal amplifier 8 is higher than the upper signal threshold value $V_{sw2}$ and the signal gain of the signal amplifier 8 is correspondingly incrementally reduced by the digital control circuit 26.

The increment H of the gain levels with which the signal gain of the signal amplifier 8 can be varied is preferably adjustable and is buffered in the digital control circuit 26. If, in the example illustrated in FIG. 2, the digital control circuit 26 recognizes from the range display data item received via the digital line 24 that the analogue signal output amplitude of the signal amplifier measured by means of the peak value detector 16 is below the lower amplitude threshold value $V_{sw1}$ (time $t_0$), it increases the gain of the signal amplifier 8 incrementally until it receives a display data item from the comparator circuit 20 at the time $t_1$, which display data item indicates that the signal amplitude now lies within the desired lock-in amplitude range II. The two analogue amplitude threshold values $V_{sw1}$, $V_{sw2}$ determine the width of the lock-in amplitude range $\Delta V_E$, i.e. the voltage and amplitude range for the signal which the CDR circuit 12 receives after the adaptation of the gain control circuit. The two analogue amplitude threshold values $V_{sw1}$, $V_{sw2}$ are preferably set to 380 mV or 500 mV for specific applications.

In one preferred embodiment of the gain control circuit according to the invention, the digital control circuit 26 not only evaluates individual range display data items but also a group of range display data items. To do this, the peak value detector 16 repeatedly measures the signal which is present on the line 14 and is output by the signal amplifier 8 and outputs a sequence of signal amplitude values to the comparator circuit 20 via the line 18. The comparator circuit 20 compares the signal amplitude values of the measured sequence with the analogue amplitude threshold values $V_{sw1}$, $V_{sw2}$ and outputs a group of display range data items to the digital control circuit 26 via the digital lines 24. The digital control circuit 26 evaluates the received digital range display data items of a display data group statistically and outputs a control signal to the signal amplifier 8 via the digital control line 28 as function of the evaluation result in order to set the signal gain.

For example, the peak value detector 16 inputs a signal measuring sequence for measuring a hundred signal amplitude values which are each compared with the amplitude threshold values $V_{sw1}$, $V_{sw2}$ in the comparator circuit 20. The comparator circuit 20 outputs to the digital control circuit 26, via the digital line 24, a range display data group composed of one hundred range display data items. If the gain of the signal amplifier 8 is much too low at the start of the measurement to compensate the amplitude attenuation owing to the transmission path 5, the portion of display data items which are located in the signal amplitude range I is 100%, i.e. the control circuit 26 receives, via the digital data line 24, binary coded display data items which each indicate that the measured signal amplitudes all lie below the first amplitude threshold value $V_{sw1}$.

In order to perform binary coding on the three reception amplitude ranges I and III, each display data item preferably has two bits, to display data items 00 designating for example the reception amplitude range I, the range display data item 01 designating the lock-in signal amplitude range II and the range display data item 10 designating the upper signal amplitude range III. The range display data item 11 is not allocated and designates an unacceptable state.

The digital control circuit 26 carries out a statistical evaluation of the received range display data items (for example 100% signal amplitude range I) and increases the gain of the signal amplifier 8 incrementally on the basis of the received range display data items until the distribution of the display data items is, for example;

| | |
|---|---|
| signal amplitude range I | 22% |
| lock-in amplitude range II | 78% |
| signal amplitude range III | 0% |

A first minimum portion threshold value, which is for example 80%, is stored in the digital control circuit. As soon as the portion of the range display data items which indicate that the signal amplitudes are located in the lock-in amplitude range II exceed this first minimum portion threshold value of for example 80%, the digital control circuit detects that the lock-in amplitude range II has been reached and keeps the gain of the signal amplifier 8 constant. In the example shown in FIG. 2, this is reached at the time $t_1$.

If the control circuit 26 receives via the digital lines 24 a group of display data items, for example, which have the following distribution:

| | |
|---|---|
| signal amplitude range I | 19% |
| lock-in amplitude range II | 81% |
| reception amplitude range III | 0%; | the digital control circuit 26 decides that the gain adaptation of the amplifier 8 has been terminated.

As a result of the statistical evaluation of the received digital display data items within the digital control circuit 26, the supplied amplitude information is low-pass-filtered in the digital fashion. As a result, noise and interference within the analogue signal processing means, which usually occurs on the voltage supply and in the signal path, are suppressed. The characteristic values of this digital filtering, like the minimum portion threshold value, can be programmed from a microprocessor via a register and can be adapted to an optimum degree to the signal noise conditions of the environment by software.

If the received analogue signal has a very high noise content, it would be conceivable that the digital control circuit 26 would not be capable of setting the signal amplifier 8 in such a way that the lock-in amplitude range or the adaptation range is reached, but rather the analogue output signal jumps to and fro between the two undesired amplitude ranges I and III.

In one preferred embodiment, the digital control circuit 26 is therefore provided with a hysteresis means for evaluating data.

After the lock-in amplitude range has been reached at the time $t_1$, the digital control circuit 26 keeps the gain of the signal amplifier 8 constant here until the portion of the obtained digital range display data items of a range display data group, which indicate that the measured signal amplitudes lie in the desired lock-in amplitude range II, drops below a predefined second minimum portion threshold value. The second minimum portion threshold value is smaller here than the first minimum portion threshold value. For example, the second minimum portion threshold value is 60, while the first minimum portion threshold value is 80. The two minimum portion threshold values are preferably freely adjustable and can be adapted to the noise signal conditions. If the portion of the display data items for the lock-in amplitude range II within a range display data group is less than 60%, the digital control circuit 26 detects that the signal has left the adaptation or lock-in amplitude range II and once more changes the gain of the signal amplifier 8 incrementally.

As a result of the digital low-pass filtering in combination with the digital hysteresis, the adaptation reliability and the noise tolerance of the automatic gain control according to the invention are very high. The width of the adaptation window, i.e. the signal amplitude range which the CRD circuit obtains after the adaptation and the noise tolerance of the gain control can be adapted to the transmission channel 5 in an optimum way. The instantaneous signal state within the control circuit is determined very precisely by repeated successive quantization in conjunction with a multiple percentile decision based thereon within the digital control circuit 26. Because the amplitude measurement and the amplitude threshold value comparison are carried out in analogue fashion, the amplitude measurement is very precise. The measured signals are evaluated in a statistically precise way on the basis of the digital evaluation of the measured analogue signals by the digital control circuit 26 so that the signal state of the amplified analogue signal can be determined precisely.

The automatic gain control circuit 1 according to the invention can be adapted to a wide variety of transmission paths by setting the analogue amplitude setting values $V_{sw1}$, $V_{sw2}$ and the minimum portion threshold values for statistical evaluation within the digital control circuit 26, and is highly precise and at the same time easy to integrate.

List of Reference Numerals:
1 automatic gain control circuit
2 analogue signal input
3 analogue signal input
4 signal line
5 transmission path
6 signal line
7 signal input
8 signal amplifier
9 signal amplifier output
10 signal line
11 line
12 CDR circuit 13 branch node
14 line
15 signal input
16 peak value detector
17 signal output
18 line
19 signal input
20 comparator circuit
21 setting lines
22 setting lines
23 comparator output
24 digital lines
25 input
26 control circuit
27 output
28 control line

What is claimed is:

1. Automatic gain control circuit for setting the gain of a signal amplifier comprising:
   a peak value detector for measuring signal amplitudes of the analogue signal which is amplified by the signal amplifier and for outputting a sequence of signal amplitude values;
   a comparator circuit which compares the measured signal amplitudes of said sequence of signal amplitude values with an upper amplitude threshold value and a lower amplitude threshold value and generates a range display data group composed of a sequence of digital range display data items which in each case indicate whether the measured signal amplitudes lie below the lower threshold value, between the two threshold values or above the upper threshold value; and
   a digital control circuit which evaluates a distribution of said digital range display data items of said range display data group statistically and incrementally changes the gain of the signal amplifier until the portion of the digital range display data items of a range display data group which indicate that the measured signal amplitudes between the amplitudes threshold values lie in a lock-in amplitude range exceeds a first predefined minimum portion threshold value.

2. Automatic gain control circuit according to claim 1, wherein the amplitude threshold values of the comparator circuit can be set in an analogue fashion.

3. Automatic gain control circuit according to claim 1, wherein after the lock-in amplitude range has been reached, the digital control circuit keeps the gain of the signal amplifier constant until the portion of the digital range display data items of said range display data group which indicate that the measured signal amplitudes lie in the lock-in amplitude range drops below a predefined second minimum portion threshold value.

4. Automatic gain control circuit according to claim 3, wherein the second minimum portion threshold value is smaller than the first minimum portion threshold value.

5. Automatic gain control circuit according to claim 1, wherein the gain level increment of the gain levels with which the gain of the signal amplifier is incrementally changed is adjustable.

6. Automatic gain control circuit according to claim 1, wherein the digital control circuit has a memory for storing the gain level increment and the minimum portion threshold values.

7. Automatic gain control circuit according to claim 1, wherein the digital control circuit is configured to buffer the digital range display data.

8. Automatic gain control circuit according to claim 3, wherein said first minimum portion threshold value is 80% and said second minimum portion threshold value is 60%.

9. Automatic gain control circuit according to claim 3, wherein said first and second minimum portion threshold values are adjustable and adaptable to noise signal conditions.

10. A method for automatic gain control of a signal amplifier, said method comprising:
   (a) measuring a sequence of signal amplitudes of a received analogue signal;
   (b) comparing the measured signal amplitudes with a lower analogue adjustable amplitude threshold value and an upper analogue adjustable amplitude threshold value;
   (c) generating a range display data group having
      a sequence of digital range display data items, and
      a range of display data items indicating, in each case for an associated measured signal amplitude, whether the measured signal amplitude lies
      below the lower threshold value,
      between the two threshold values, or
      above the upper threshold value; and
   (d) evaluating a distribution of said digital range display data items of said range display data group statistically, and
   (e) incrementally changing the signal gain of the signal amplifier until the portion of the range display data items of a range display data group which indicate that the associated measured signal amplitudes between the two threshold values lie in a lock-in amplitude range exceeds a predefined minimum portion threshold value.

* * * * *